United States Patent
Park

(10) Patent No.: US 10,950,510 B2
(45) Date of Patent: Mar. 16, 2021

(54) SEMICONDUCTOR DEVICE AND METHOD OF FABRICATING THE SAME

(71) Applicant: SAMSUNG ELECTRONICS CO., LTD., Suwon-si (KR)

(72) Inventor: Seok Han Park, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/538,184

(22) Filed: Aug. 12, 2019

(65) Prior Publication Data

US 2020/0203239 A1 Jun. 25, 2020

(30) Foreign Application Priority Data

Dec. 21, 2018 (KR) .................. 10-2018-0167539

(51) Int. Cl.
| | | |
|---|---|---|
| *H01L 23/08* | (2006.01) | |
| *H01L 23/522* | (2006.01) | |
| *H01L 21/768* | (2006.01) | |
| *H01L 21/02* | (2006.01) | |

(52) U.S. Cl.
CPC .......... *H01L 23/08* (2013.01); *H01L 23/5222* (2013.01); *H01L 21/02203* (2013.01); *H01L 21/7682* (2013.01)

(58) Field of Classification Search
CPC . H01L 23/08; H01L 23/5222; H01L 21/7682; H01L 21/02203; H01L 21/02118; H01L 21/02282; H01L 21/0228; H01L 21/02126
See application file for complete search history.

(56) References Cited

U.S. PATENT DOCUMENTS

| | | | |
|---|---|---|---|
| 7,071,091 B2 | 7/2006 | Clarke et al. | |
| 9,184,058 B2 | 11/2015 | Brown et al. | |
| 9,443,956 B2 | 9/2016 | Yu et al. | |
| 9,490,202 B2 | 11/2016 | Lin et al. | |
| 9,780,008 B2 | 10/2017 | Ono et al. | |
| 9,865,738 B2 | 1/2018 | Kim | |
| 9,911,605 B2 | 3/2018 | Heo et al. | |
| 10,043,809 B1 | 8/2018 | Chang et al. | |
| 2001/0007788 A1* | 7/2001 | Chang ................. | H01L 21/7682 438/421 |
| 2014/0367825 A1* | 12/2014 | Kim .................... | H01L 23/5329 257/522 |
| 2015/0228754 A1* | 8/2015 | Sung ................... | H01L 29/6653 438/595 |
| 2016/0284806 A1* | 9/2016 | Park ....................... | H01L 29/51 |
| 2017/0278786 A1 | 9/2017 | Inoue et al. | |
| 2017/0294310 A1 | 10/2017 | Tapily et al. | |
| 2017/0317212 A1* | 11/2017 | Kim ..................... | H01L 29/785 |

FOREIGN PATENT DOCUMENTS

KR 10-0672823 B1 1/2007

* cited by examiner

*Primary Examiner* — Lex H Malsawma
*Assistant Examiner* — Gardner W. S. Swan
(74) *Attorney, Agent, or Firm* — Lee IP Law, PC

(57) ABSTRACT

A semiconductor device includes a base substrate, a protruding structure on the base substrate, a porous film on a side surface and an upper surface of the protruding structure, and an air gap between at least a part of the side surface of the protruding structure and the porous film.

17 Claims, 15 Drawing Sheets

SEMICONDUCTOR DEVICE AND METHOD OF FABRICATING THE SAME

CROSS-REFERENCE TO RELATED APPLICATION

Korean Patent Application No. 10-2018-0167539, filed on Feb. 21, 2018, in the Korean Intellectual Property Office, and entitled: "Semiconductor Device and Method of Fabricating the Same," is incorporated by reference herein in its entirety.

BACKGROUND

1. Field

Embodiments relate to a semiconductor device and a method of fabricating the same.

2. Description of the Related Art

As semiconductor devices are highly integrated, the distance between the wiring layers becomes narrower. An insulating layer used between wiring layers may have a high dielectric constant. The capacitance between the wiring layers can be increased due to the high dielectric constant of the insulating layer. As the capacitance increases, a signal delay may occur, and accordingly the characteristics of the semiconductor device may be degraded.

SUMMARY

Embodiments are directed to a semiconductor device, including a base substrate, a protruding structure on the base substrate, a porous film on a side surface and an upper surface of the protruding structure, and an air gap between at least a part of the side surface of the protruding structure and the porous film.

Embodiments are also directed to a semiconductor device, including a base substrate, a protruding structure on the base substrate, a porous film extended along a side surface of the protruding structure, and an air gap between a side surface of the protruding structure and an inner surface of the porous film. An upper surface of the base substrate may include a first point spaced from the side surface of the protruding structure by a first distance, and a second point spaced apart therefrom by a second distance greater than the first distance, and a height of the air gap at the first point may be greater than a height of the air gap at the second point.

Embodiments are also directed to a semiconductor device, including a base substrate, a protruding structure on the base substrate, a porous film extended along a side surface of the protruding structure, and an air gap between the side surface of the protruding structure and the porous film, the air gap including a first part having a width continuously decreasing away from an upper surface of the base substrate.

BRIEF DESCRIPTION OF THE DRAWINGS

Features will become apparent to those of skill in the art by describing in detail example embodiments with reference to the attached drawings in which.

DETAILED DESCRIPTION

Figure 1:
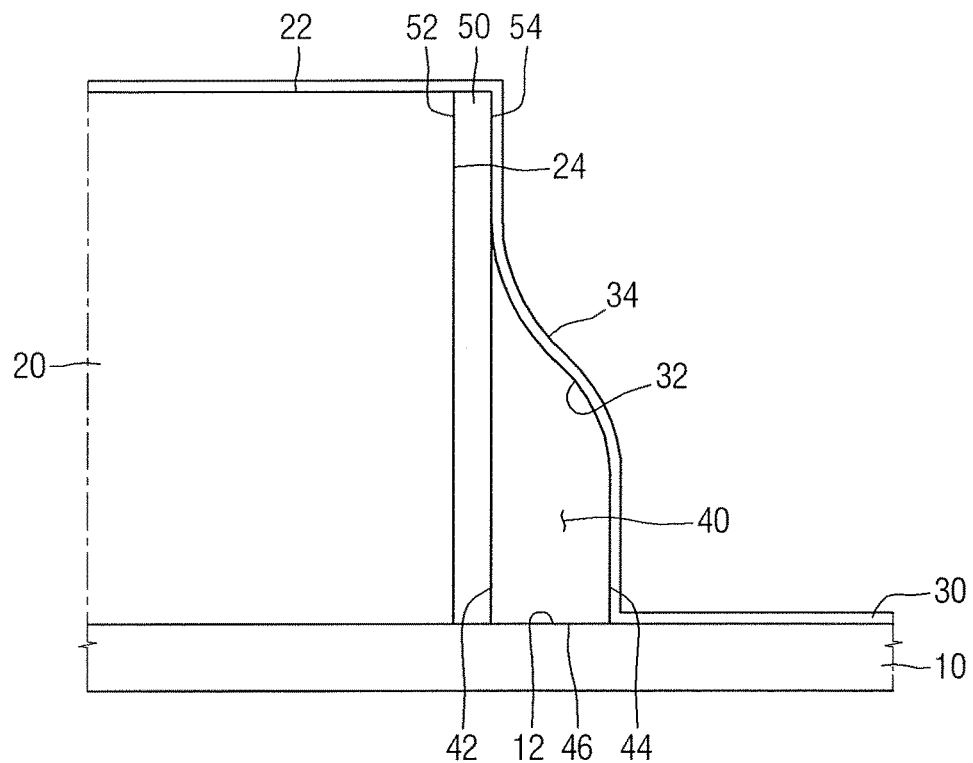
FIG. 1 illustrates a cross-sectional view of a semiconductor device according to some example embodiments.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey example implementations to those skilled in the art. In the drawing figures, the dimensions of layers and regions may be exaggerated for clarity of illustration. Like reference numerals refer to like elements throughout.

Figure 2:
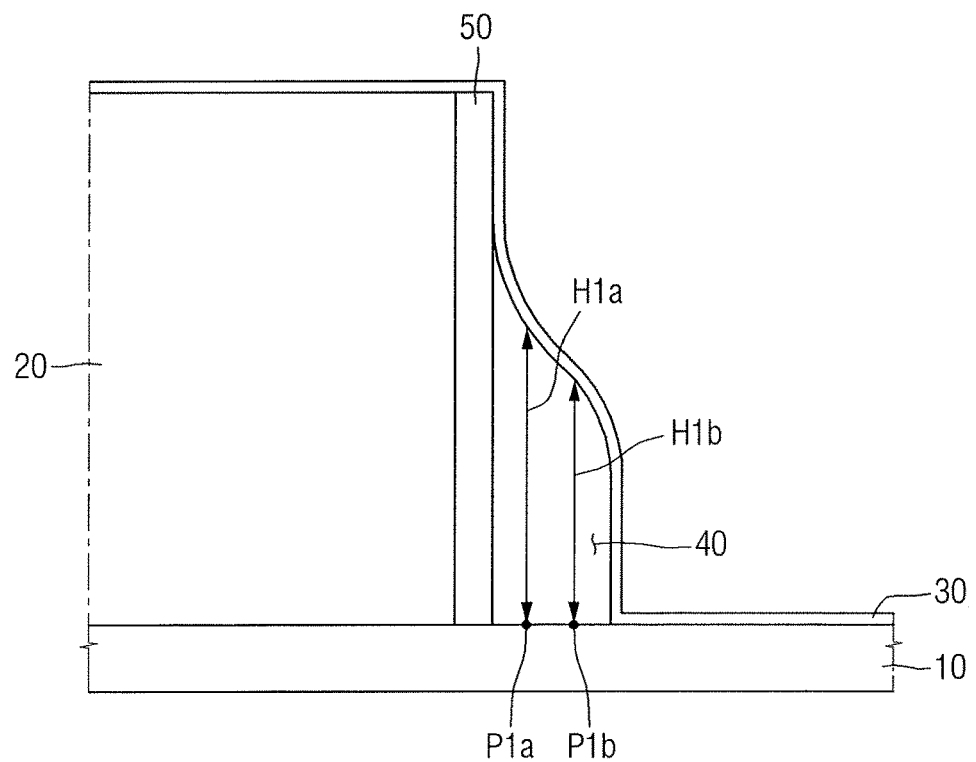
FIG. 2 illustrates a view of the height difference of the air gap of FIG. 1.
Figure 3:
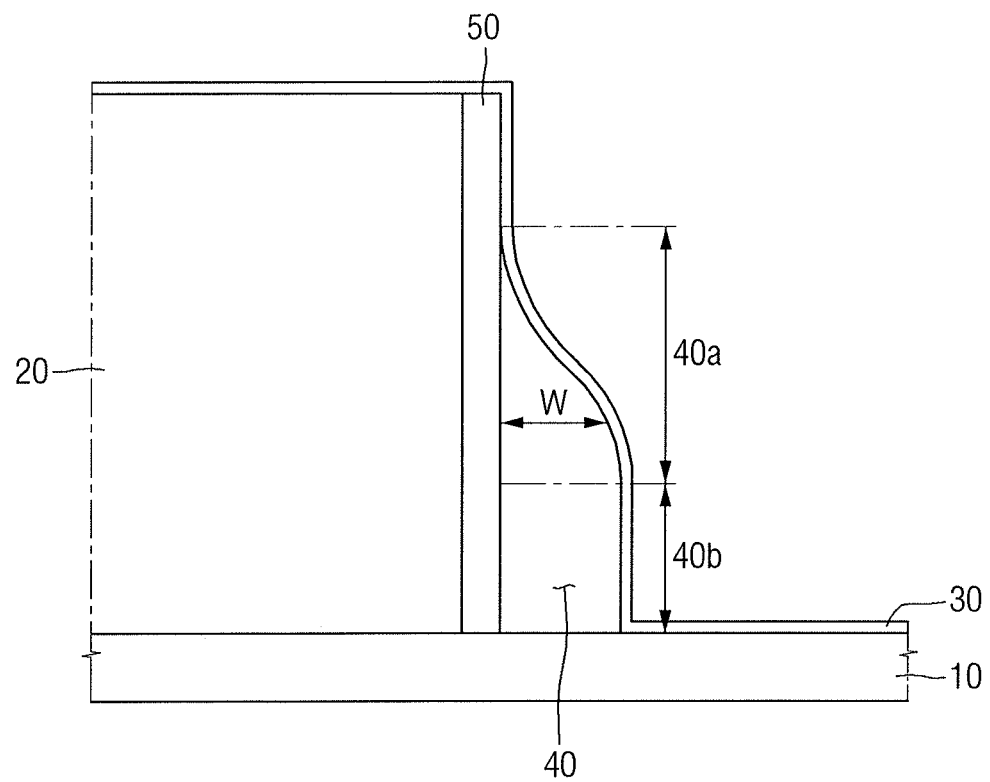
FIG. 3 illustrates a view of the width difference of the air gap of FIG. 1.
Figure 5:
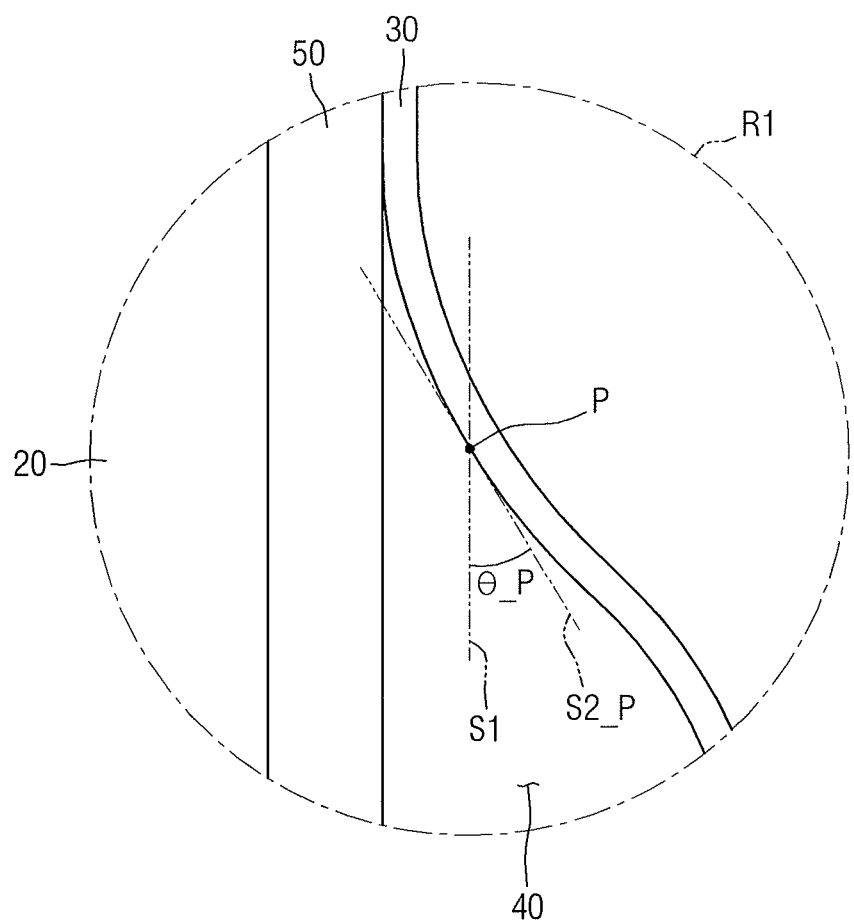
Figure 6:
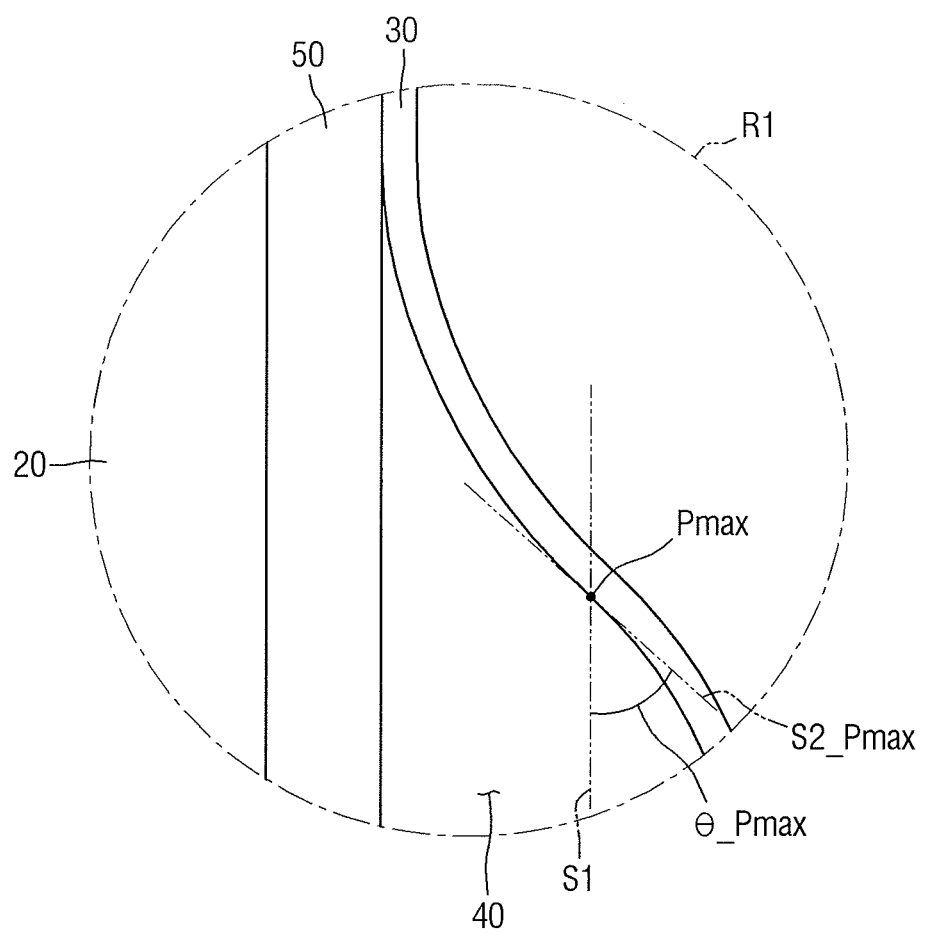
Figure 7:
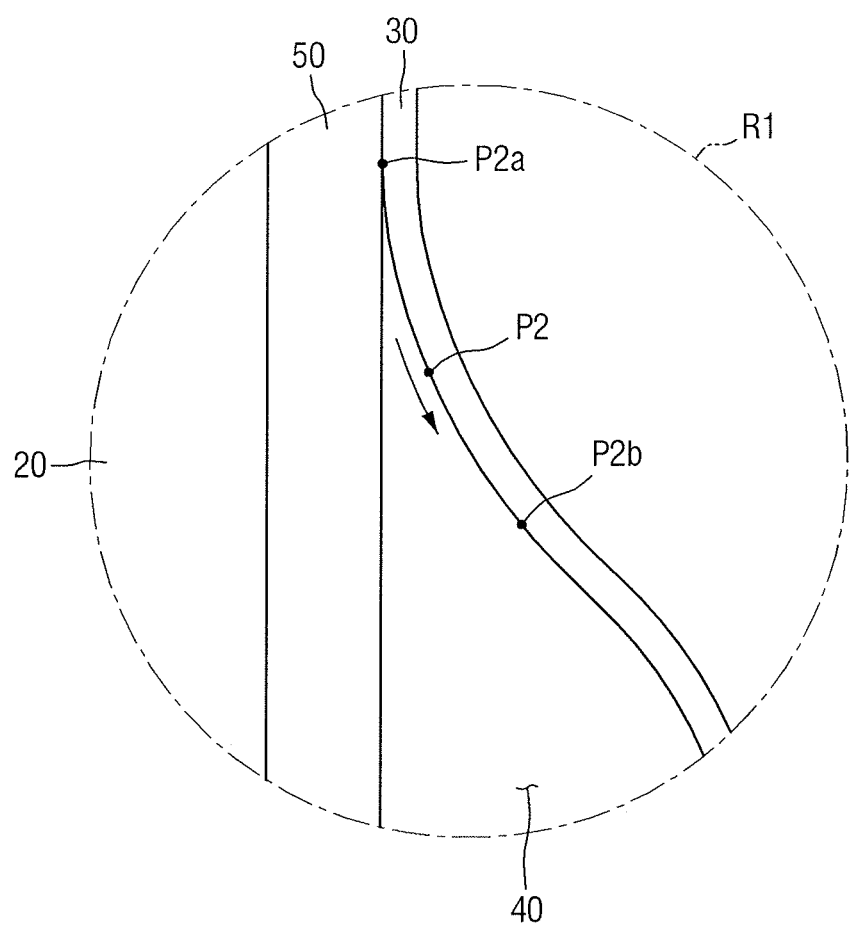

Hereinafter, a semiconductor device according to some example embodiments will be described with reference to FIGS. 1 to 7. FIG. 1 is a cross-sectional view for illustrating a semiconductor device according to some example embodiments. FIG. 2 is a view for illustrating the height difference of the air gap of FIG. 1. FIG. 3 is a view for illustrating the width difference of the air gap of FIG. 1. FIGS. 4 to 7 are views for illustrating the shape of the air gap of FIG. 1. It is to be noted that FIGS. 5 to 7 are cross-sectional views for illustrating region R1 of FIG. 4.

Referring to FIG. 1, a semiconductor device according to some example embodiments may include a substrate 10, a protruding structure 20, a porous film 30, an air gap 40, and a dielectric layer 50.

The substrate 10 may be a silicon substrate, or may be a substrate made of materials such as silicon germanium (SiGe), indium antimonide (InSb), lead-telluride (PbTe) compound, indium arsenide (InAs), indium phosphide (InP), gallium arsenide (GaAs), or gallium antimonide (GaSb). In another implementation, the substrate 10 may be formed by growing an epitaxial layer on a base substrate.

The protruding structure 20 may protrude from the substrate 10. The protruding structure 20 may be on the upper surface 12 of the substrate 10. The protruding structure 20 may include the same material as the substrate 10 or the protruding structure 20 may include a different material from the substrate 10.

The dielectric layer 50 may be on the side surface 24 of the protruding structure 20. Thus, the inner side surface 52 of the dielectric layer 50 may face the side surface 24 of the protruding structure 20. The dielectric layer 50 may include, for example, one or more of silicon oxide, silicon nitride, or silicon oxynitride.

The porous film 30 may be on the upper surface 22 and the side surface 24 of the protruding structure 20. The porous film 30 may have an inner surface 32 and an outer surface 34. The inner surface 32 of the porous film 30 may include a part extended along the upper surface 22 of the protruding structure 20.

The inner surface 32 of the porous film 30 may include a first part extended along the outer surface 54 of the dielectric layer 50, and a second part defining the air gap 40. The first part of the inner surface 32 of the porous film 30 may be in contact, e.g., direct contact, with the dielectric layer 50. The second part of the inner surface 32 of the porous film 30 may be in contact with an outer surface 44 of the air gap 40 formed on the side surface 24 of the protruding structure 20.

A part of the porous film 30 may be on the upper surface 12 of the substrate 10. Thus, the part of the porous film 30 may face a part of the upper surface 12 of the substrate 10.

The porous film 30 may be an insulating film including a plurality of pores. The porous film 30 may allow oxygen ($O_2$), carbon dioxide ($CO_2$), and water ($H_2O$) to pass through the plurality of pores. The porous film 30 may block silicon oxide or silicon nitride from passing through the plurality of pores. The porous film 30 may include silicon oxide and/or silicon nitride deposited by an atomic layer deposition (ALD) process. The porous film 30 may include silicon oxide or silicon nitride deposited by an atomic layer deposition (ALD) process at a temperature above a room temperature or ambient temperature and below 400° C.

The air gap 40 may be defined between at least a part of the side surface 24 of the protruding structure 20 and the inner surface 32 of the porous film 30. An inner surface 42 of the air gap 40 may be in contact with a part of the outer surface 54 of the dielectric layer 50. The outer surface 44 of the air gap 40 may be in contact with a part of the inner surface 32 of the porous film 30. The lower surface 46 of the air gap 40 may be on the upper surface 12 of the substrate 10. For example, as illustrated in FIG. 1, the air gap 40 may be, e.g., enclosed by the outer surface 54 of the dielectric layer 50 and the inner surface 32 of the porous film 30, and the lower surface 46 of the air gap 40 may be in direct contact with the inner surface 32 of the porous film 30. The air gap 40 may be filled with air. The air in the air gap 40 may have a low dielectric constant of approximately one (1). The air gap 40 between the semiconductor elements may lower the capacitance between the semiconductor elements.

Referring to FIG. 2, the air gap 40 may have a wedge-like shape. The upper surface 12 of the substrate 10 may include a virtual first point P1a spaced apart from the protruding structure by a first distance. The upper surface 12 of the substrate 10 may include a virtual second point P1b spaced apart from the protruding structure by a second distance greater than the first distance. The height H1a of the air gap 40 at the first point P1a may be greater than the height H1b of the air gap 40 at the second point P1b.

Referring to FIG. 3, the air gap 40 may include a first part 40a and a second part 40b. The width of the first part 40a of the air gap 40 may be reduced away from the upper surface 12 of the substrate 10. The second part 40b of the air gap 40 may have a constant width regardless of the distance from the substrate.

Figure 4:
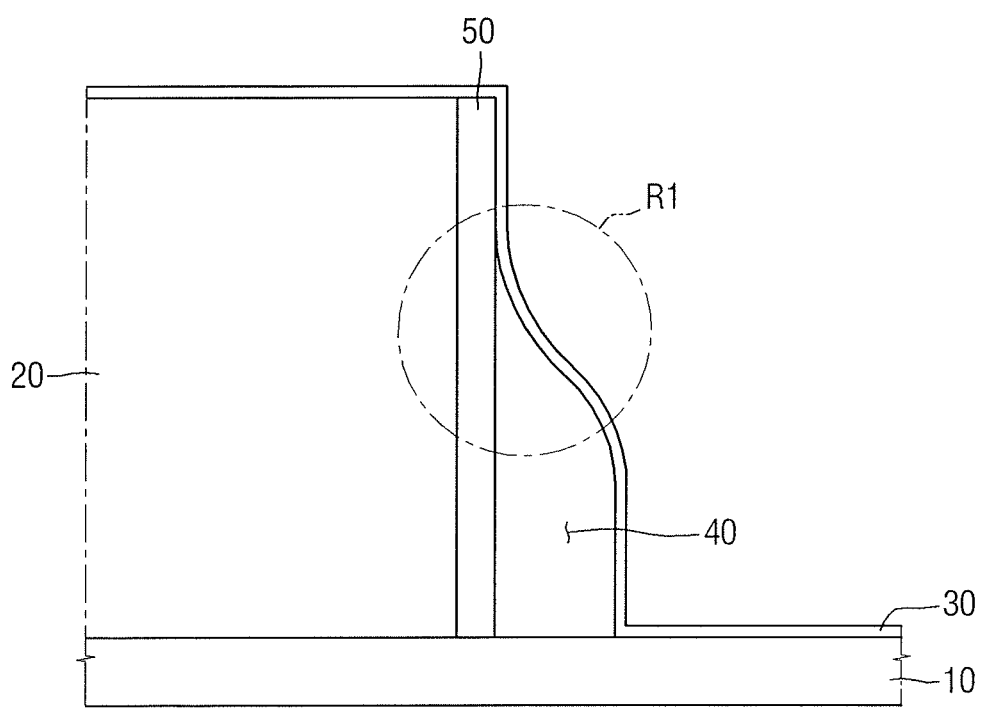
FIGS. 4 to 7 illustrate views for illustrating the shape of the air gap of FIG. 1.

Referring to FIG. 4, in region RI, a part of the porous film 30 may be in contact with a part of the dielectric layer 50, and the remaining part of the porous film 30 may be in contact with a part of the air gap 40. The interface between the porous film 30 and the dielectric layer 50 may be smoothly connected to the interface between the porous film 30 and the air gap 40.

Referring to FIG. 5, the inner surface of the porous film 30 may include a virtual point P in region R1. At the point P on the inner surface of the porous film 30, the inclination of the inner surface of the porous film 30 may be represented as an angle $\theta\_P$ formed between the plane S1 in parallel with the side surface of the protruding structure 20 and the inner surface $S2\_P$ of the porous film 30.

Referring to FIG. 6, the inner surface of the porous film 30 may include a virtual maximum inclination point $P_{max}$ in region R1, which has the gentlest inclination. For example, at the maximum inclination point $P_{max}$, the angle $\theta\_P_{max}$ formed between the plane S1 in parallel to the side surface of the protruding structure 20 and the inner surface $S2\_P_{max}$ of the porous film 30 may be 90° or less.

As such, the inner surface of the porous film 30 does not include a depressed shape. If the inner surface of the porous film 30 includes a depressed shape, the angle $\theta\_P_{max}$ formed between the plane S1 parallel to the side surface of the protruding structure 20 and the inner surface $S2\_P_m$ of the porous film 30 exceeds 90°. In contrast, in the semiconductor device according to some example embodiments, the angle $\theta\_P_{max}$ formed between the plane S1 parallel to the side surface of the protruding structure 20 and the inner surface $S2\_P_{max}$ of the porous film 30 does not exceed 90°

Referring to FIG. 7, the inner surface of the porous film 30 may be extended smoothly along the outer surface of the dielectric layer 50 and the outer surface of the air gap 40. The inner surface of the porous film 30 may include a virtual moving point P2 that is gradually moving away from the outer surface of the dielectric layer 50.

The moving point P2 may move from the point P2a to the point P2b along the inner surface of the porous film 30. The point P2a may be located at a point on the contact portion between the inner surface of the porous film 30 and the outer surface of the dielectric layer 50. The point P2b may be located at a point on the contact portion between the inner surface of the porous film 30 and the outer surface of the air gap 40.

The angle formed between the outer surface of the protruding structure 20 and the inner surface of the porous film 30 at the moving point P2 may continuously vary as it moves along the inner surface of the porous film 30. The angle formed between the outer surface of the protruding structure 20 and the inner surface of the porous film 30 at the moving point P2 may be obtained in the same manner as the angle formed between the outer surface of the protruding structure 20 and the inner surface of the porous film 30 at the point P as shown in FIG. 5.

Thus, as the moving point P2 on the inner surface of the porous film 30 moves from the point P2a on the outer surface of the dielectric layer 50 to the point P2b on the outer surface of the air gap 40, the inner surface of the porous film 30 may be smoothly extended.

If the angle formed between the outer surface of the protruding structure 20 and the inner surface of the porous film 30 does not vary continuously along the inner surface of the porous film 30 (i.e., if the inner surface of the porous film 30 includes a point that changes discontinuously), the porous film 30 may not be extended smoothly, and the inner surface of the porous film 30 may include a non-smooth edge at a point where the angle between the outer surface and the inner surface of the porous film 30 varies discontinuously. In contrast, in the semiconductor device according to some example embodiments, the inner surface of the porous film 30 does not include a point where the angle between the outer surface of the protruding structure and the inner surface of the porous film 30 varies discontinuously.

Figure 8:
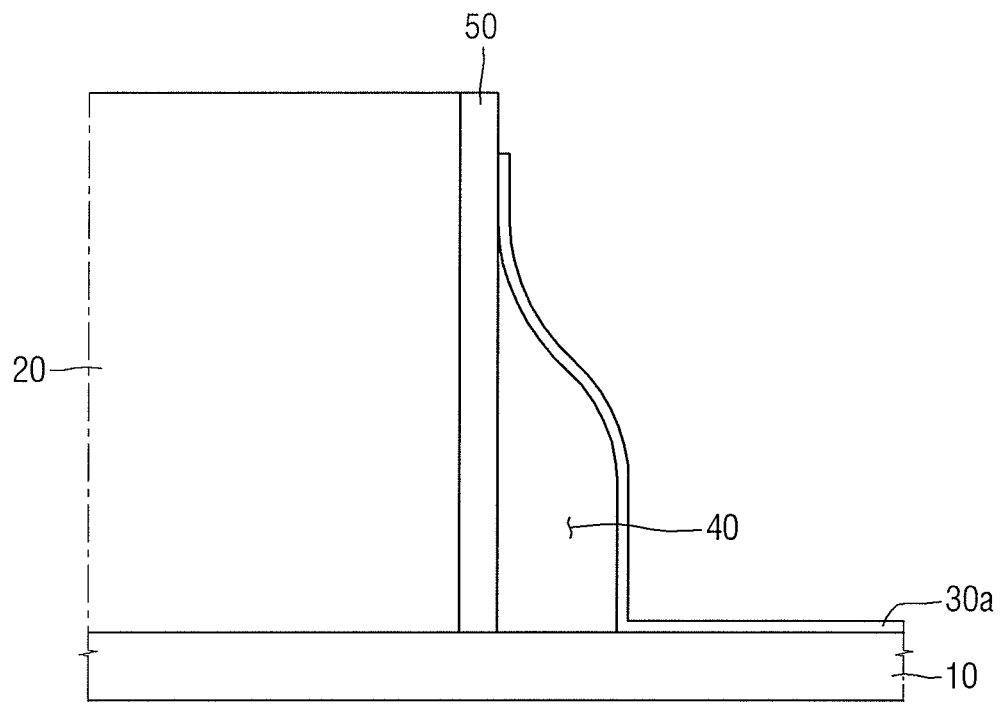
FIG. 8 illustrates a cross-sectional view of a semiconductor device according to some example embodiments.

Hereinafter, a semiconductor device according to some example embodiments will be described with reference to FIG. 8. FIG. 8 is a cross-sectional view for illustrating a semiconductor device according to some example embodiments. For convenience of illustration, descriptions will focus on the differences from those described above with respect to FIGS. 1 to 7.

Referring to FIG. 8, a semiconductor device may include a porous film 30a on a side surface of a protruding structure 20. The inner surface of the porous film 30a may be in contact with a part of the outer surface of the dielectric layer 50 and the outer surface of an air gap 40. Thus, the porous film 30a may not be on the upper surface of the protruding structure 20. The porous film 30a may be disposed to cover a part of the side surface of the protruding structure 20.

The air gap 40 may be formed between a part of the side surface of the protruding structure 20 and the inner surface of the porous film 30. Thus, the air gap 40 may be defined by the outer surface of the dielectric layer 50, the inner surface of the porous film 30, and the upper surface of the substrate 10.

Figure 9:
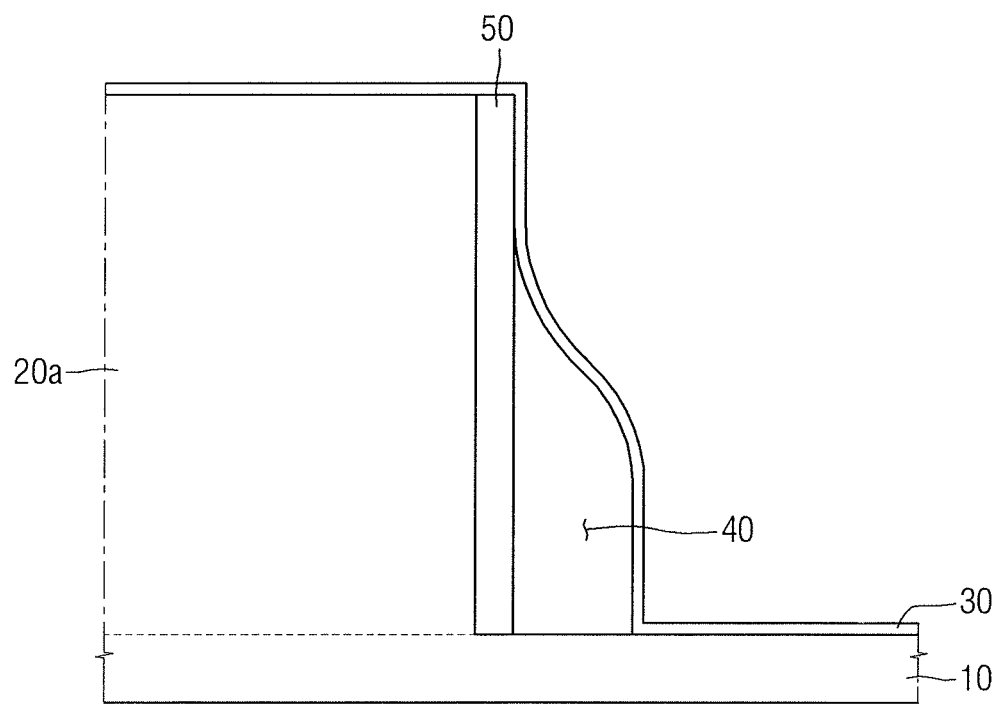
FIG. 9 illustrates a cross-sectional view of a semiconductor device according to some example embodiments.

Hereinafter, a semiconductor device according to some example embodiments will be described with reference to FIG. 9. FIG. 9 is a cross-sectional view for illustrating a semiconductor device according to some example embodiments. For convenience of illustration, descriptions will focus on the differences from those described above with respect to FIGS. 1 to 8.

Referring to FIG. 9, a semiconductor device may include a protruding structure 20a on a substrate 10 in the form of an integral structure with the substrate 10. For example, each of the protruding structure 20a and the substrate 10 may be a part of a single integral substrate. Thus, the protruding structure 20a may be defined as a protruded portion of the integrated substrate. The substrate 10 may be defined as the rest of the integrated substrate except the protruding structure 20a.

Figure 10:
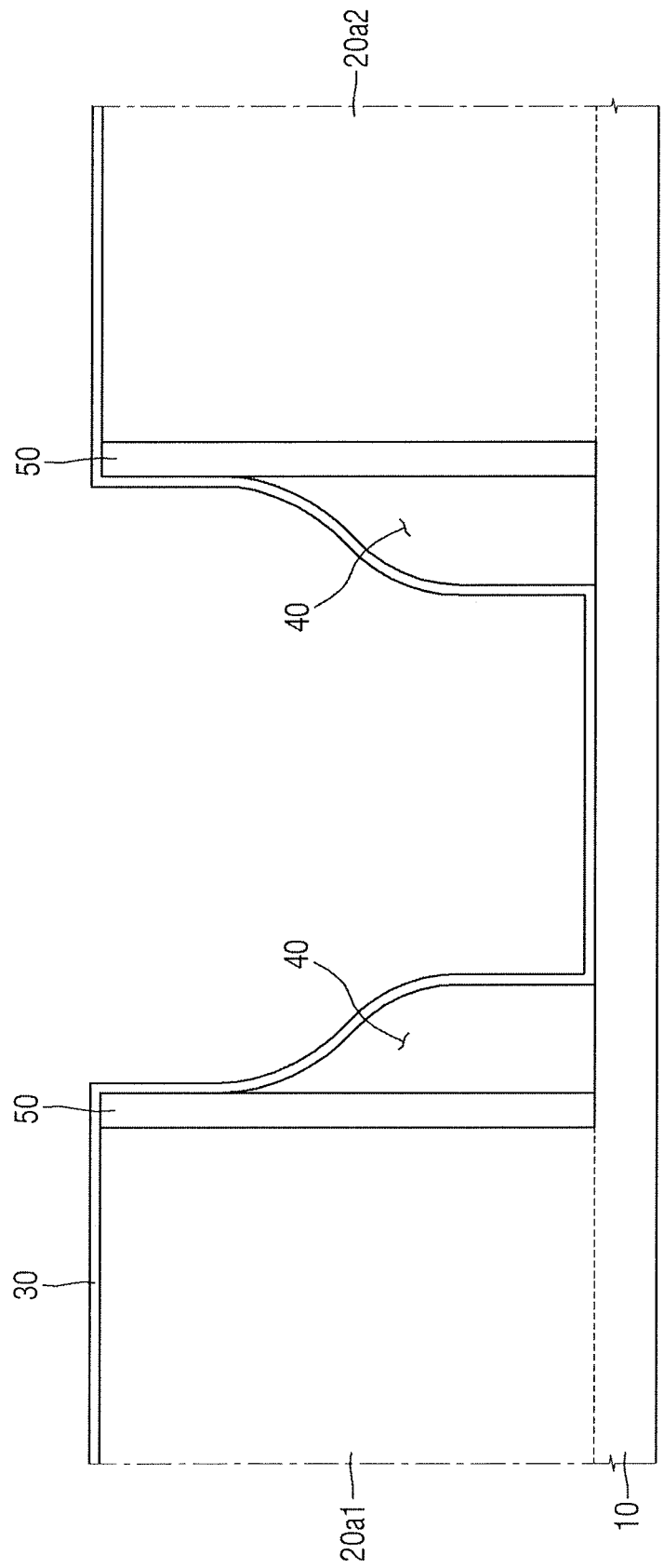
FIG. 10 illustrates a cross-sectional view of a semiconductor device according to some example embodiments.

Hereinafter, a semiconductor device according to some example embodiments will be described with reference to FIG. 10. FIG. 10 is a cross-sectional view for illustrating a semiconductor device according to some example embodiments. For convenience of illustration, descriptions will focus on the differences from those described above with respect to FIGS. 1 to 9.

Referring to FIG. 10, a semiconductor device may include a first protruding structure 20a1 and a second protruding structure 20a2 on a substrate 10. The first and second protruding structures 20a1 and 20a2 may form an integral structure with the substrate 10. The first and second protruding structures 20a1 and 20a2 may form a trench structure along with the substrate 10. The first and second protruding structures 20a1 and 20a2 may be both sidewalls of the trench structure, respectively, and the upper surface of the substrate 10 and the side surfaces of the first and second protruding structures 20a1 and 20a2 may define the trench structure.

The porous film 30 may be on the upper surface and side surface of each of the first and second protruding structures 20a1 and 20a2. The porous film 30 may be on the upper surface of the substrate 10. The dielectric layer 50 may be on the side surface of each of the first and second protruding structures 20a1 and 20a2. The air gap 40 may be disposed between the porous film 30 and a part of the side surface of each of the first and second protruding structures 20a1 and 20a2. Thus, the air gap 40 may be formed on each of the side walls of the trench structure.

Figure 11:
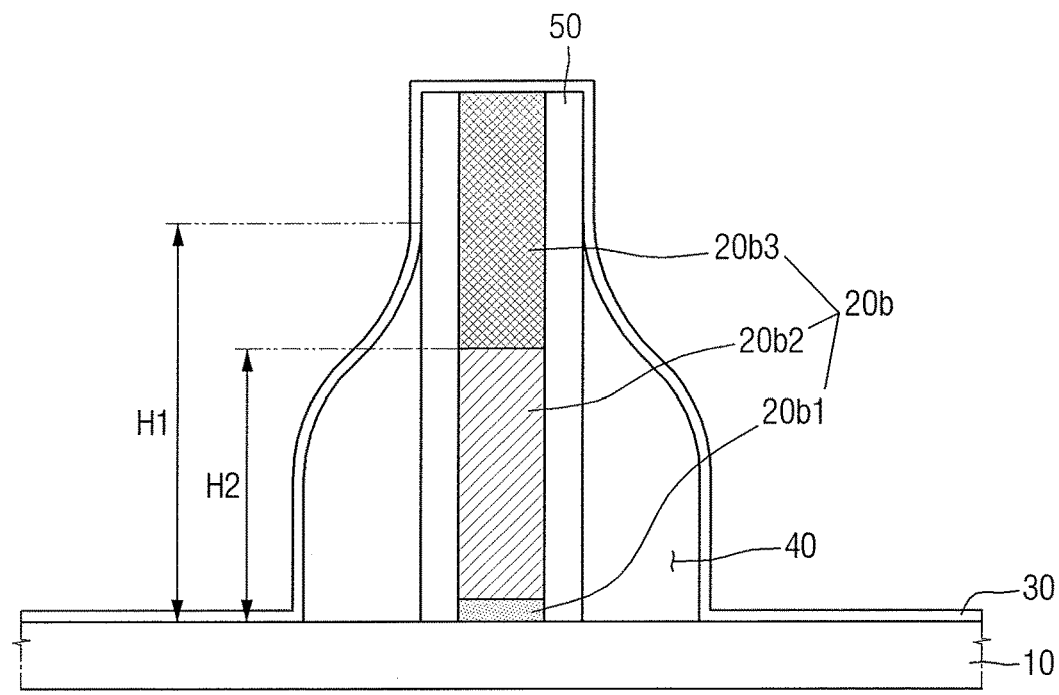
FIG. 11 illustrates a cross-sectional view of a semiconductor device according to some example embodiments.

Hereinafter, a semiconductor device according to some example embodiments will be described with reference to FIG. 11. FIG. 11 is a cross-sectional view for illustrating a semiconductor device according to some example embodiments. For convenience of illustration, descriptions will focus on the differences from those described above with respect to FIGS. 1 to 10.

Referring to FIG. 11, a semiconductor device may include a protruding structure 20b on a substrate 10. The protruding structure 20b may include an interlayer dielectric film 20b1, a conductive layer 20b2, and a capping layer 20b3.

The interlayer dielectric film 20b1 may be on the substrate 10. Although the interlayer dielectric film 20b1 is shown as a plane parallel to the substrate 10 in FIG. 11, the interlayer dielectric film 20b1 may be formed on the substrate 10 and may include, for example, a U-shape that surrounds a part of the conductive layer 20b2.

The interlayer dielectric film 20b1 may include, for example, one or more of a low-k dielectric material, an oxide film, a nitride film, or an oxynitride film. The low-k dielectric material may include, for example, flowable oxide (FOX), tonen silazen (TOSZ), undoped silica glass (USG), borosilica glass (BSG), phosphosilica glass (PSG), borophosphosilica glass (BPSG), plasma enhanced tetra ethyl ortho silicate (PETEOS), fluoride silicate glass (FSG), carbon doped silicon oxide (CDO), xerogel, aerogel, amorphous fluorinated carbon, organo silicate glass (OSG), parylene, bis-benzocyclobutenes (BCB), SiLK, polyimide, porous polymeric material, or a combination thereof.

The conductive layer 20b2 may be on the interlayer dielectric film 20b1. Thus, the conductive layer 20b2 may be disposed between the interlayer dielectric film 20b1 and the capping layer 20b3. The conductive layer 20b2 may include a conductive material. The conductive layer 20b2 may include at least one metal or may include a conductive semiconductor material.

The capping layer 20b3 may be on the conductive layer 20b2. The capping layer 20b3 may be an insulating layer formed on the upper surface of the conductive layer 20b2. The capping layer 20b3 may include a silicon nitride film, for example.

In the semiconductor device according to the example embodiment shown in FIG. 11, the dielectric layer 50 may be on each of the side walls of the protruding structure 20b. The inner surface of the dielectric layer 50 may be on the side surfaces of the interlayer dielectric film 20b1, the conductive layer 20b2 and the capping layer 20b3. The air gap 40 may be on each of the side surfaces of the protruding structure 20. The air gap 40 may be on each of the outer surfaces of the protruding structure 20b.

The first height H1 from the substrate 10 to the air gap 40 may be greater than the second height H2 from the substrate 10 to the conductive layer 20b2. The first height H1 may refer to the height from the upper surface of the substrate 10 to the point where the air gap 40, the dielectric layer 50 and the porous film 30 meet. The second height H2 may refer to the height from the upper surface of the substrate 10 to the upper surface of the conductive layer 20b2. As such, the air gap 40 may be disposed at a higher level than the conductive layer 20b2 disposed inside the protruding structure 20.

Figure 12:
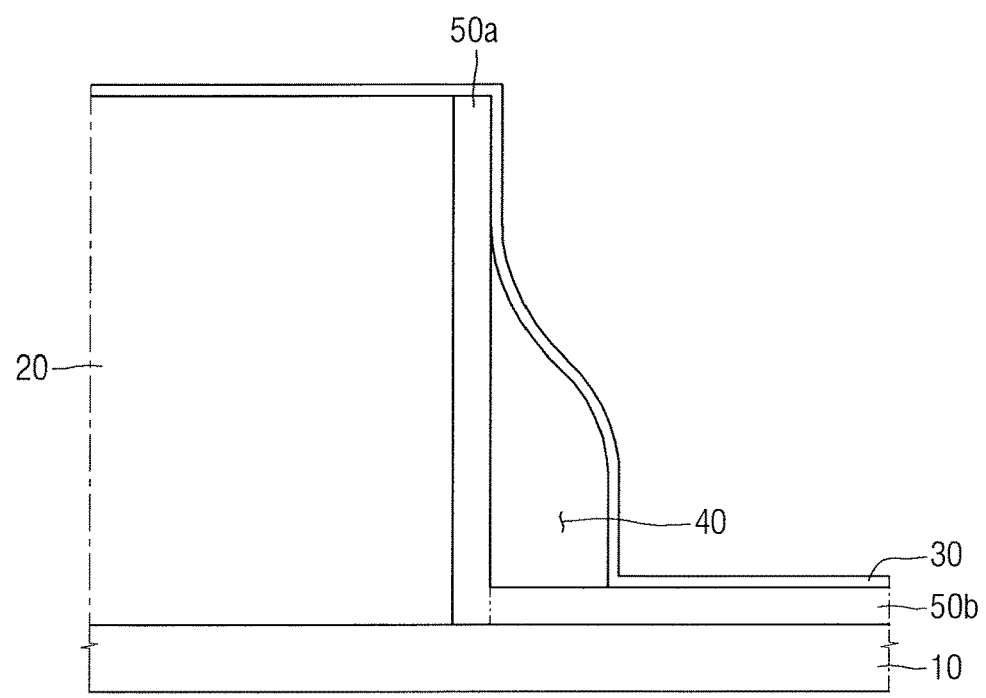
FIG. 12 illustrates a cross-sectional view of a semiconductor device according to some example embodiments.

Hereinafter, a semiconductor device according to some example embodiments will be described with reference to FIG. 12. FIG. 12 is a cross-sectional view for illustrating a semiconductor device according to some example embodiments. For convenience of illustration, descriptions will focus on the differences from those described above with respect to FIGS. 1 to 11.

Referring to FIG. 12, a semiconductor device may include a dielectric layer 50b on the upper surface of a substrate 10. The dielectric layer 50a on the side surface of the protruding structure 20 may be extended along the upper surface of the substrate 10.

In the semiconductor device according to the example embodiment shown in FIG. 12, the air gap 40 may be defined by the outer surface of the dielectric layer 50 and the inner surface of the porous film 30. The inner surface and the lower surface of the air gap 40 may be in contact with parts of the outer surface of the dielectric layer 50. The outer surface of the air gap 40 may be in contact with a part of the inner surface of the porous film 30.

Figure 13:
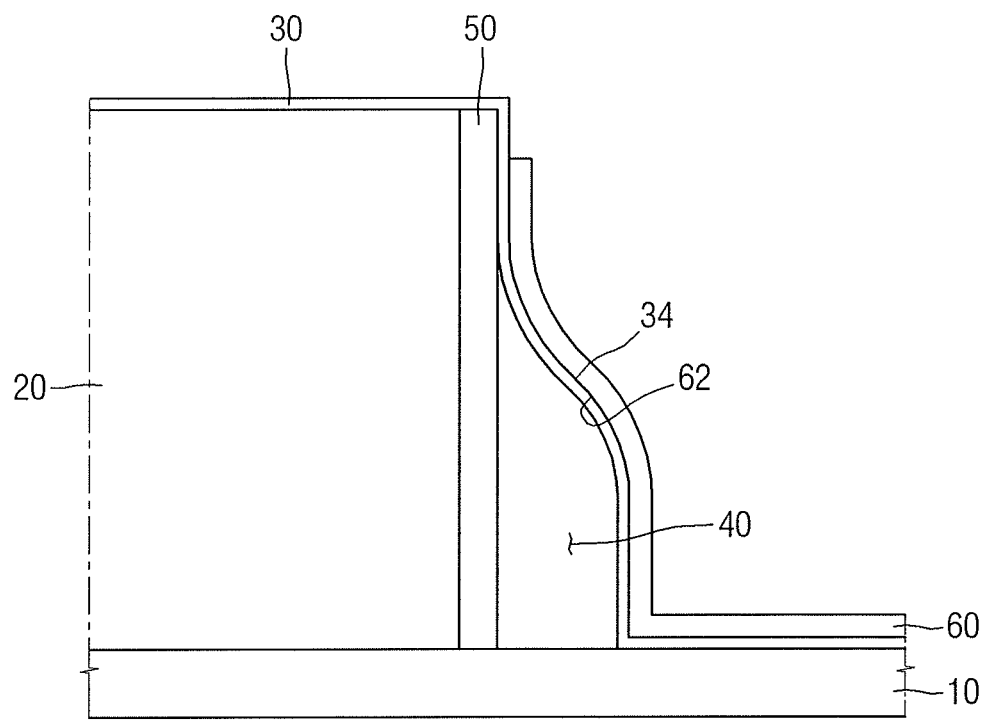
FIG. 13 illustrates a cross-sectional view of a semiconductor device according to some example embodiments.

Hereinafter, a semiconductor device according to some example embodiments will be described with reference to FIG. 13. FIG. 13 is a cross-sectional view for illustrating a semiconductor device according to some example embodiments. For convenience of illustration, descriptions will focus on the differences from those described above with respect to FIGS. 1 to 12.

Referring to FIG. 13, a semiconductor device may include an outer insulating layer 60 surrounding a part of a porous film 30. For example, as shown in FIG. 13, the outer insulating layer 60 may surround a part of the porous film 30 on the side surface of the protruding structure 20 and the porous film 30 disposed along the upper surface of the substrate. In another implementation, the outer insulating layer 60 may be disposed to surround a part of the porous film 30, including the porous film 30 on the upper surface of the protruding structure 20.

The outer insulating layer 60 may include one or more of a silicon oxide film, a silicon nitride (SiN) film, a silicon carbonitride (SiCN) film, a silicon oxycarbonitride (SiOCN) film, a silicon oxycarbide (SiOC) film, or a silicon oxynitride film. The material forming the outer insulating layer 60 may not pass through the plurality of pores in the porous film 30.

Figure 14:
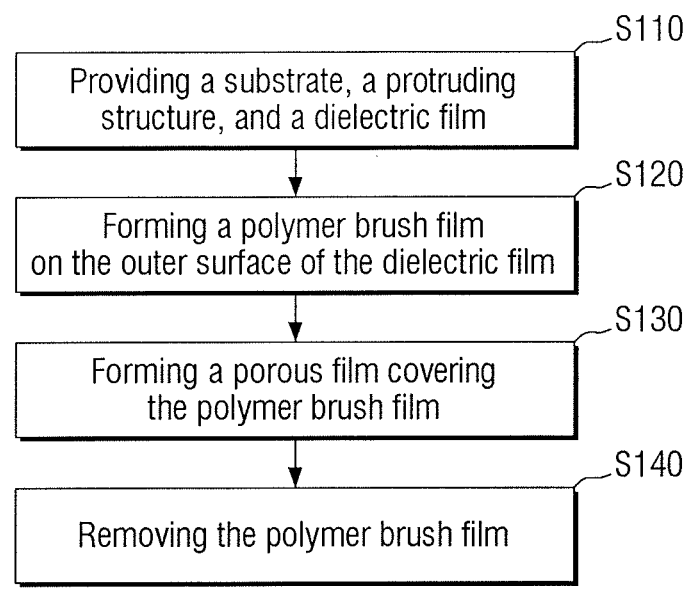
FIG. 14 illustrates a flowchart of a method for fabricating a semiconductor device according to some example embodiments.
Figure 15:
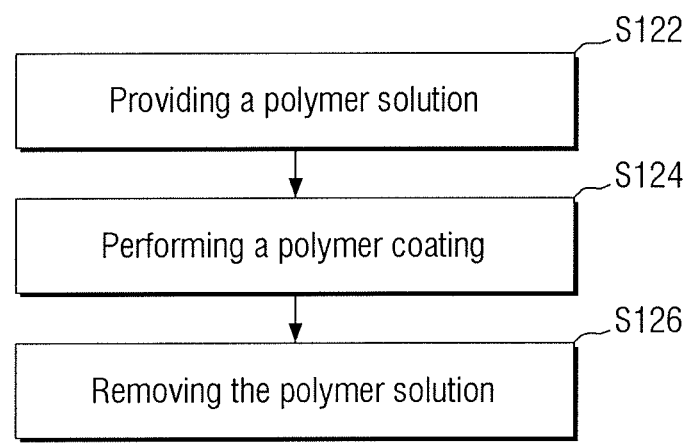
FIG. 15 illustrates a flowchart of operation S120 in detail.
Figure 16:
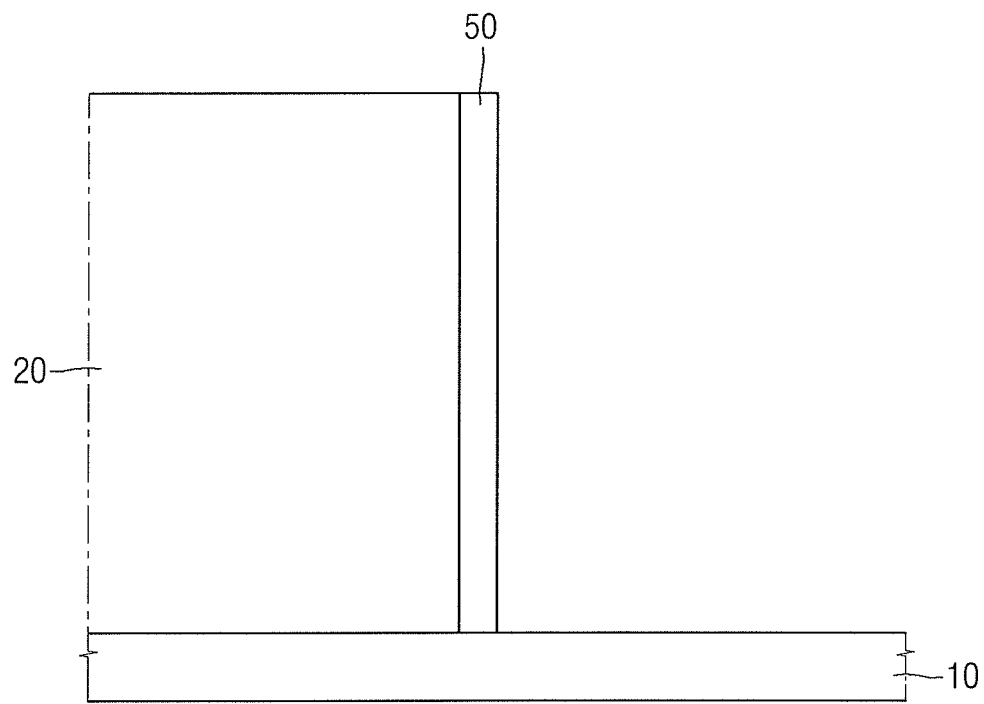
FIG. 16 illustrates a cross-sectional view of operation S110 of FIG. 14 in detail.
Figure 17:
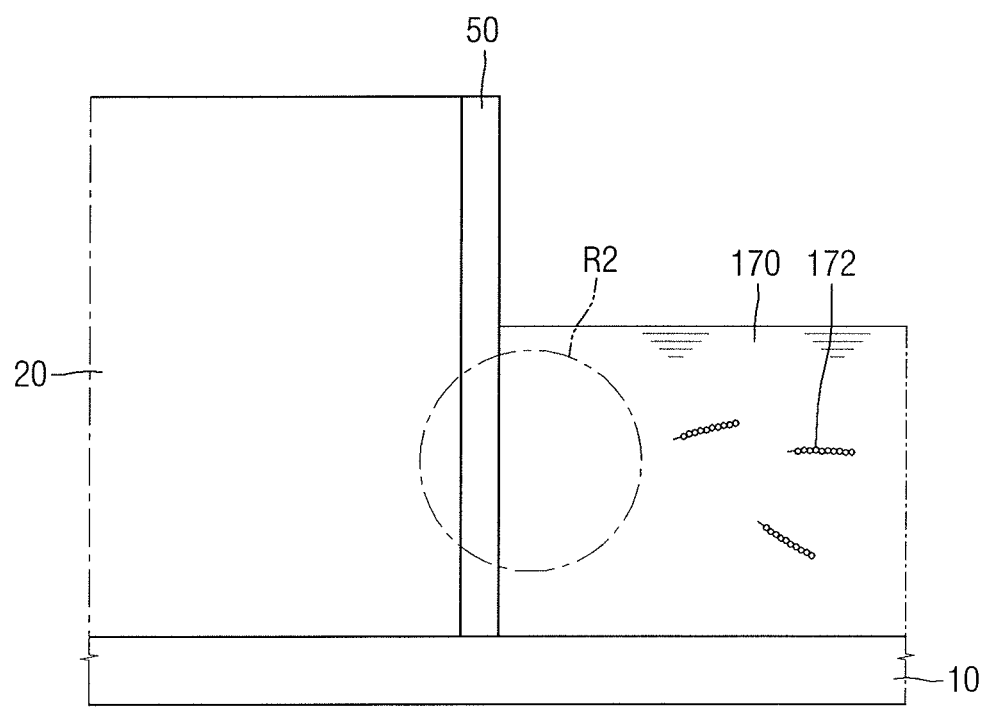
FIG. 17 illustrates a cross-sectional view of operation S112 of FIG. 15 in detail.
Figure 18:
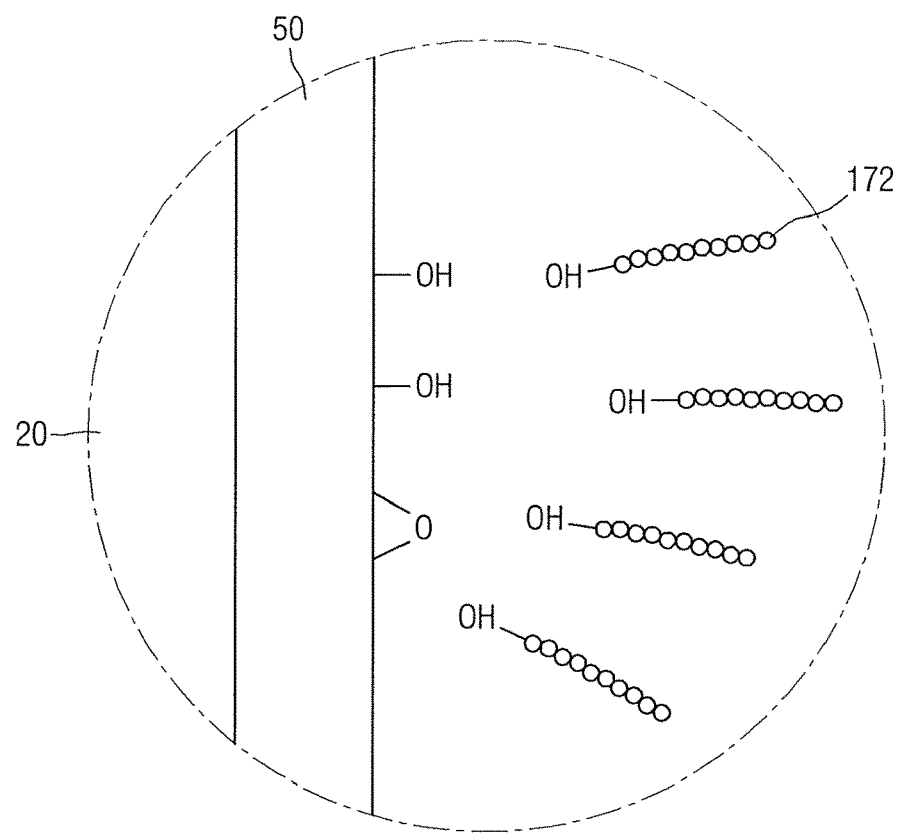
FIG. 18 illustrates an enlarged view of region R2 of FIG. 17.
Figure 19:
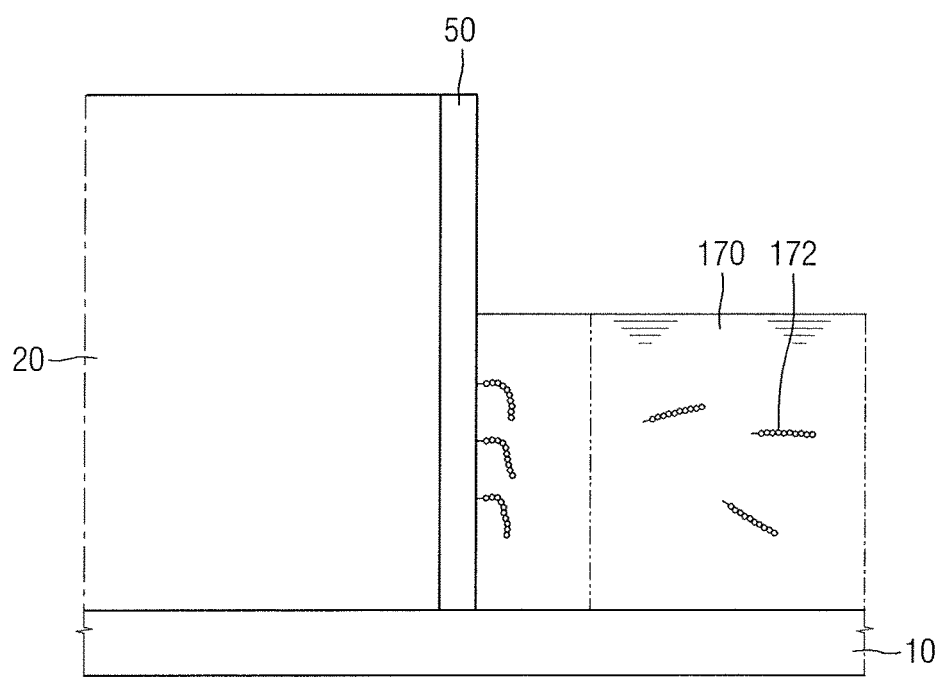
FIG. 19 illustrates a cross-sectional view of operations S124 and S126 of FIG. 15 in detail.
Figure 20:
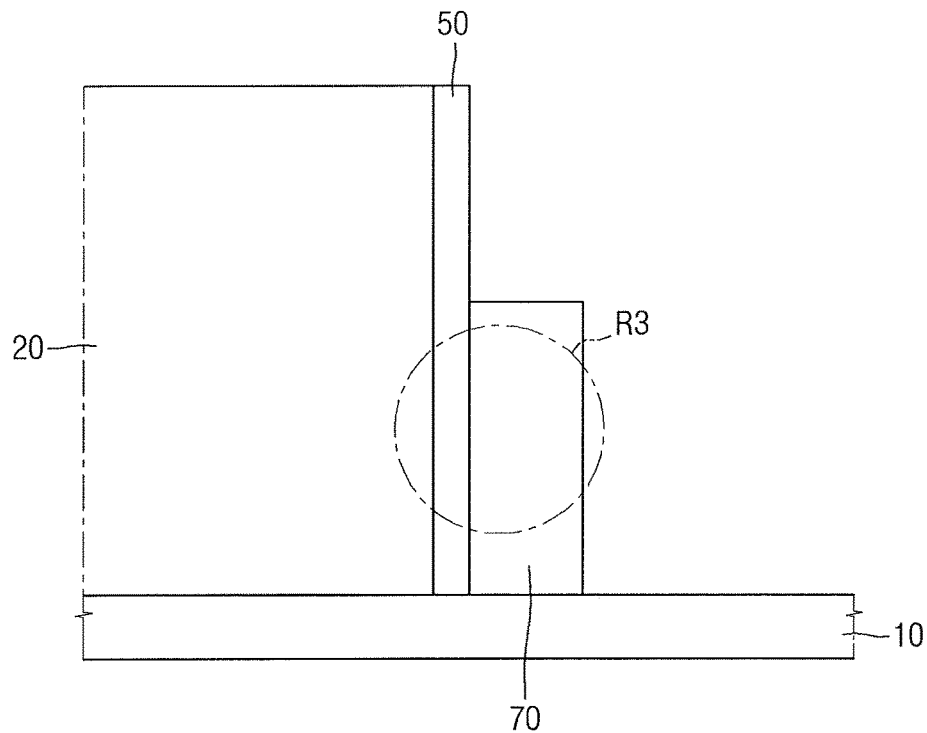
FIG. 20 illustrates a cross-sectional view of a polymer brush film formed by operation S120 of FIG. 14.
Figure 21:
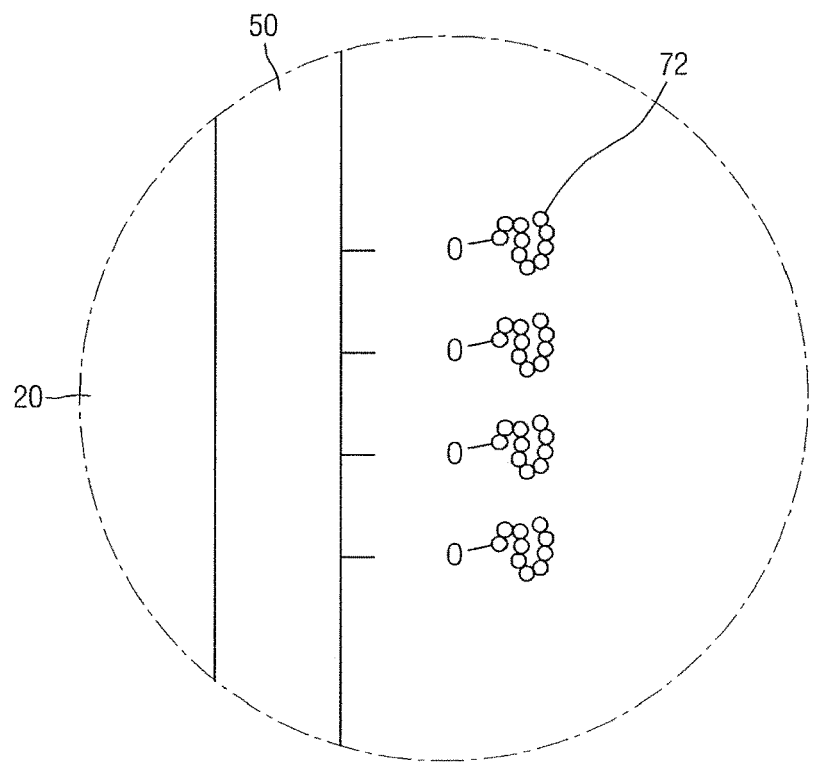
FIG. 21 illustrates an enlarged view of region R3 of FIG. 19.
Figure 22:
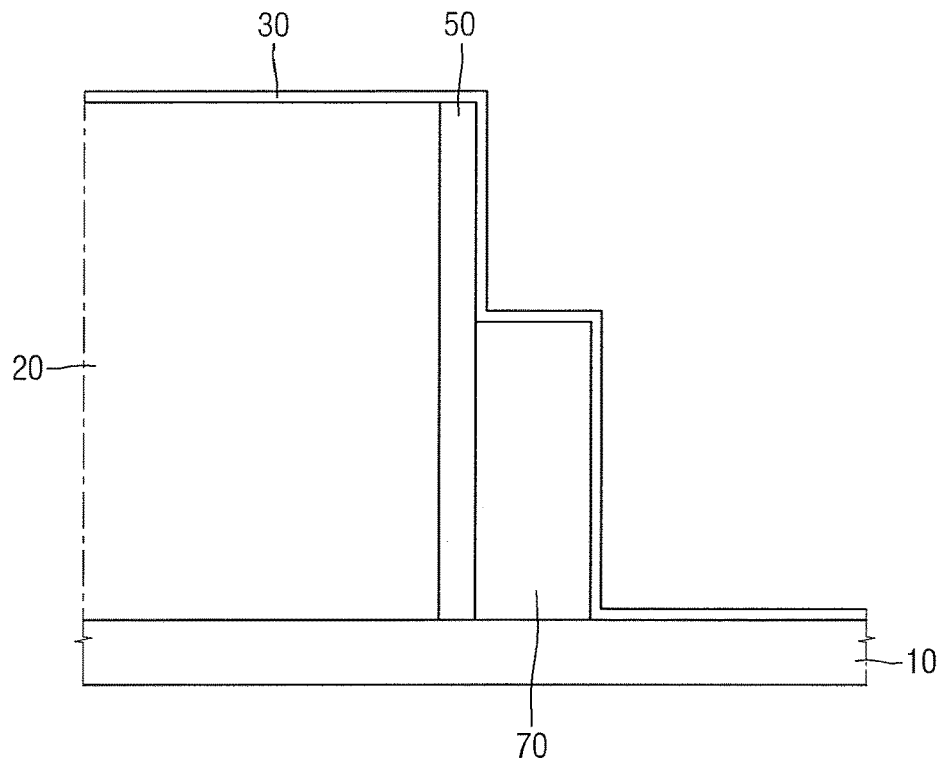
FIG. 22 illustrates a cross-sectional view of operation S130 of FIG. 14 in detail.
Figure 23:
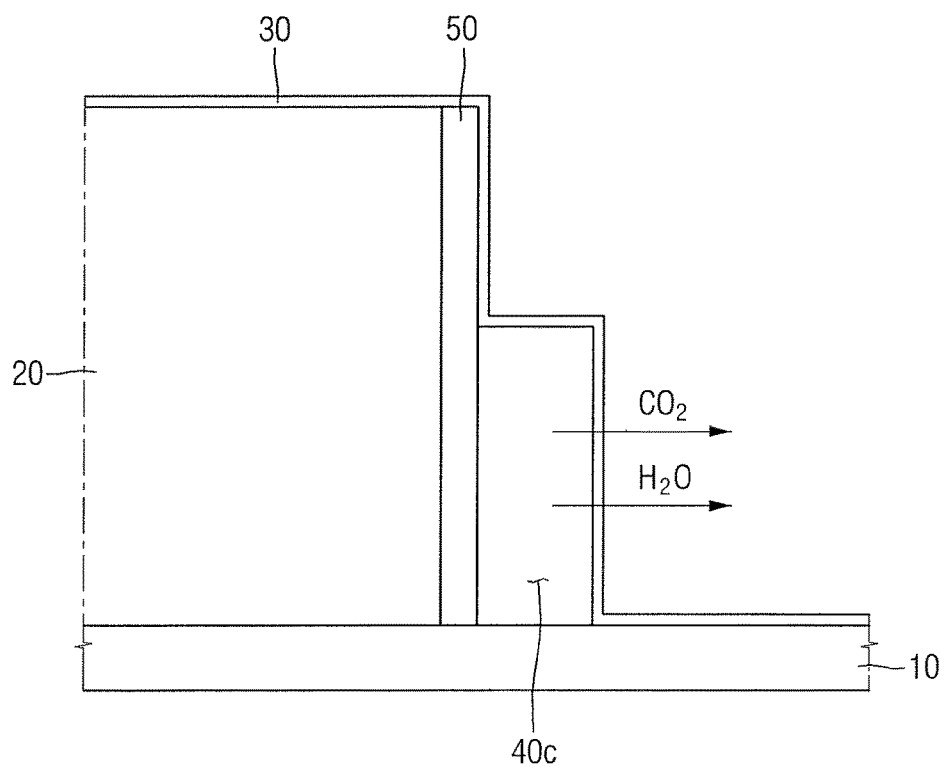
FIG. 23 illustrates a cross-sectional view of operation S140 of FIG. 14 in detail.
Figure 24:
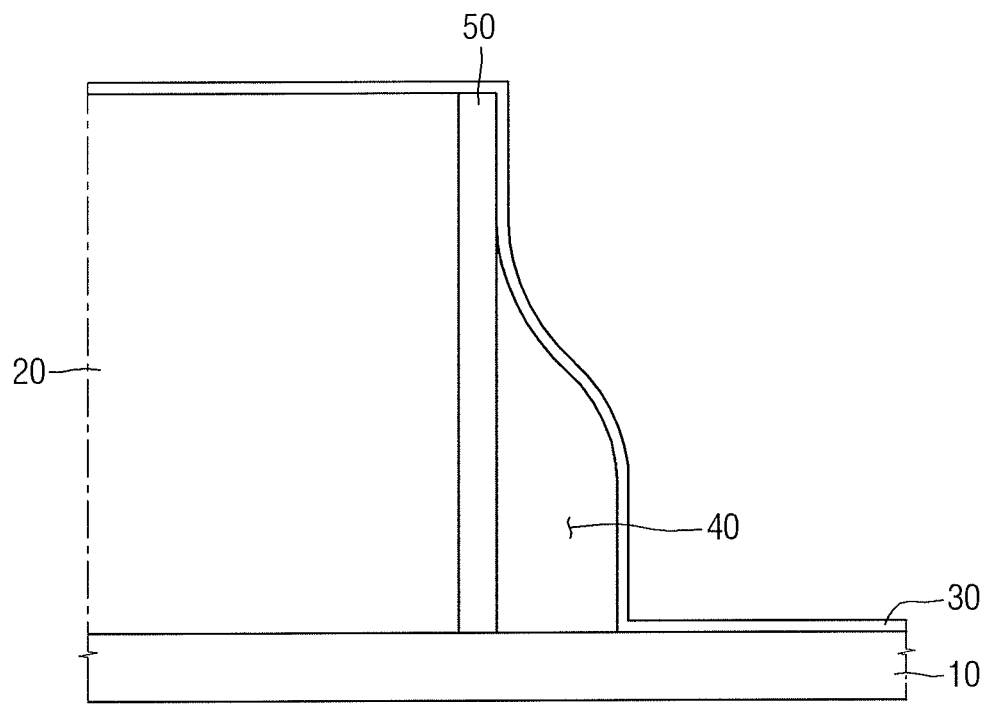
FIG. 24 illustrates a cross-sectional view of the air gap formed by the method for fabricating a semiconductor device of FIG. 14.

Hereinafter, a method of fabricating a semiconductor device according to some example embodiments will be described with reference to FIGS. 14 to 24. FIG. 14 is a flowchart for illustrating a method of fabricating a semiconductor device according to some example embodiments. FIG. 15 is a flowchart for illustrating operation S120 in detail. FIG. 16 is a cross-sectional view for illustrating operation S110 of FIG. 14 in detail. FIG. 17 is a cross-sectional view for illustrating operation S122 of FIG. 15 in detail. FIG. 18 is an enlarged view of region R2 of FIG. 17. FIG. 19 is a cross-sectional view for illustrating steps S124 and S126 of FIG. 15 in detail. FIG. 20 is a cross-sectional view for illustrating a polymer brush film formed by operation S120 of FIG. 14. FIG. 21 is an enlarged view of region R3 of FIG. 19. FIG. 22 is a cross-sectional view for illustrating operation S130 of FIG. 14 in detail. FIG. 23 is a cross-sectional view for illustrating operation S140 of FIG. 14 in detail. FIG. 24 is a cross-sectional view for illustrating the air gap formed by the method of fabricating a semiconductor device of FIG. 14.

Referring to FIG. 14, a method of fabricating a semiconductor device according to some example embodiments may include preparing a substrate, a protruding structure, and a dielectric layer (operation S110).

For example, referring to FIG. 16, in operation S110, a substrate 10, a protruding structure 20, and a dielectric layer 50 may be provided. The protruding structure 20 may be provided as a side wall of a trench formed in an integrated substrate. For another example, the protruding structure 20 may be provided as a conductive structure formed on the substrate 10.

The dielectric layer 50 may be formed along the side surface of the protruding structure 20. Although the dielectric layer 50 is shown as not formed along the upper surface of the substrate in FIG. 16, the dielectric layer 50 may be formed along the upper surface of the substrate 10.

Referring back to FIG. 14, a method of fabricating a semiconductor device according to some example embodiments may include forming a polymer brush film on an outer surface of the dielectric layer (operation S120).

For example, referring to FIG. 15, the forming the polymer brush film on the outer surface of the dielectric layer (operation S120) may include providing a polymer solution (operation S122).

For example, referring to FIGS. 16 and 17, a polymer solution 170 may be provided to fill the space defined by the side surface of the protruding structure 20 and the upper surface of the substrate 10. The polymer solution 170 used in the polymer brushing process is shown as including polymers 172 and a solvent in the example shown in FIG. 17. In another implementation, the polymer solution 170 may be, for example, a melting solution consisting solely of the polymers 172.

The polymers 172 included in the polymer solution 170 may include polystyrene (PS) or poly methyl methacrylate (PMMA), for example.

The polymers 172 contained in the polymer solution 170 may be used as a material for forming the polymer brush film 70, which will be described in detail with reference to FIG. 20. Thus, in order to make the thickness of the polymer brush film 70 uniform, the polymers 172 having a uniform molecular weight may be used.

The polymers used in the polymer brushing process may have a uniform molecular weight distribution. Such distribution may be defined by the polydispersity index (PDI). The PDI may be a value (Mw/Mn) obtained by dividing a weight-average molecular weight (Mw) by a number-average molecular weight (Mn).

The number-average molecular weight (Mn) may be obtained by dividing the total molecular weight of polymers by the number of the polymers (e.g., in mol). The weight-average molecular weight (Mw) may be obtained by dividing the sum of the squares of the molecular weights of the respective polymers by the total molecular weight.

The polydispersity index (PDI) may be used as a criterion for representing the width of the molecular weight distribution. For example, as the PDI approaches one, the polymers have a more uniform molecular weight.

In the method of fabricating a semiconductor device according to some example embodiments, the polymers 172 contained in the polymer solution 170 may have a polydispersity index (PDI) of 1 to 1.5.

Referring to FIG. 18, the polymers 172 may be provided on the outer surface of the dielectric layer 50 by the providing the polymer solution in operation S122. The dielectric layer 50 may include, for example, hydroxy groups and/or epoxide groups, as in the example shown in FIG. 18. The polymers 172 may include, for example, hydroxy groups, as in the example shown in FIG. 18.

Referring back to FIG. 15, the forming the polymer brush film on the outer surface of the dielectric layer S120 may include performing polymer coating (operation S124).

For example, referring to FIG. 19, polymer coating may be performed on the outer surface of the dielectric layer 50. For example, when a heat treatment process is performed while the polymers 172 are provided on the outer surface of the dielectric layer 50 as shown in FIG. 17, hydroxy groups or epoxide groups on the outer surface of the dielectric layer 50 may form covalent bonds with hydroxy groups of the polymers 172. The polymers 172 coated on the outer surface of the dielectric layer 50 may be formed as a single layer. The layer formed by the polymers 172 coated on the outer surface of the dielectric layer 50 may become the polymer brush film 70, which will be described with reference to FIG. 20.

Referring back to FIG. 15, the forming the polymer brush film on the outer surface of the dielectric layer (operation S120) may include removing the polymer solution (operation S126).

For example, referring to FIG. 19, excess polymer solution 170 not used for the polymer coating may still remain on the upper surface of substrate 10 and on the side surface of dielectric layer 50. In operation S124 of removing the polymer solution 170, the polymer solution 170 containing the polymers 172 that were not involved in the reaction may be cleaned using water, an organic solvent, etc.

FIG. 20 shows the polymer brush film 70 formed by the operation S120 of forming the polymer brush film on the outer surface of the dielectric layer 50 of FIG. 14. The height of the polymer brush film 70 may be determined by the height of the polymer solution 170 provided in the step shown in FIG. 17. In some example embodiments, the height of the polymer brush film 70 may be adjusted by a dry or wet etching process.

In the method of fabricating a semiconductor device according to some example embodiments, when the dielectric layer 50 is on the upper surface of the substrate 10, the polymer coating may be performed also on the outer surface of the dielectric layer 50 on the upper surface of the substrate 10. Thus, the polymer brush film may be formed along the upper surface of the substrate 10. The polymer brush film formed along the upper surface of the substrate 10 may be removed by a dry or wet etching process. For example, by performing a dry or wet etching process, it is possible to adjust the height of the polymer brush film 70 and to remove the polymer brush film formed along the upper surface of the substrate 10.

FIG. 21 shows the polymer brush film 70 formed in region R3 of FIG. 20 in detail. The polymer brush film 70 may include polymeric elements 72 having covalent bonds with the outer side wall of the dielectric layer 50. The polymer elements 72 may be produced as the shape of the polymers 172 are deformed by the heat treatment process or the like performed in operation S124. The polymeric elements 72, like the polymers 172, may include a plurality of carbons. Thus, the polymer brush film 70 may include a carbon layer.

Referring back to FIG. 14, the method of fabricating a semiconductor device according to some example embodiments may include forming a porous film covering the polymer brush film (operation S130).

For example, referring to FIG. 22, the porous film 30 may be formed along the upper surface of the protruding structure 20, the outer surface of the dielectric layer 50, the outer surface of the polymer brush film 70, and the upper surface of the substrate 10. The porous film 30 may be formed, for example, by a deposition process.

The porous film 30 may be, for example, silicon nitride or silicon oxide deposited by a low-temperature ALD process. The porous film 30 may be silicon nitride or silicon oxide deposited by an ALD process performed, for example, at a temperature above the room temperature and below 400° C. The porous film 30 deposited by the low-temperature ALD process may not be dense. Thus, the porous film 30 may include a plurality of pores.

Referring back to FIG. 14, the method of fabricating a semiconductor device according to some example embodiments may include removing the polymer brush film (operation S140).

For example, referring to FIG. 23, the polymer brush film 70 may be removed by an ashing process. For example, in the ashing process, oxygen ($O_2$) may be transferred to the polymer brush film 70 through the plurality of pores of the porous film 30. The polymer brush film 70 may be oxidized by oxygen to produce by-products, e.g., gases, such as carbon dioxide ($CO_2$) and water vapor ($H_2O$). Such by-products generated in the ashing process may be eliminated through the pores of the porous film 30. Thus, the carbon dioxide and water produced via the ashing process may exit out of the porous film 30.

When the polymer brush film 70 in the inside 40c of the porous film 30 is removed by the ashing process, the inside 40c of the porous film 30 may be filled with air. For example, after the brush film 70 is removed, gas may occupy the space of the inside 40c of the porous film 30. The inside 40c of the porous film 30 may be filled with, for example, nitrogen ($N_2$), oxygen ($O_2$), or carbon dioxide ($CO_2$) through the pores of the porous film 30. The porous film 30 may be stretched or shaped by the air to have the smooth shape illustrated in FIG. 24.

FIG. 24 shows an air gap formed by the method of fabricating a semiconductor device illustrated in FIG. 14. When the inside of the porous film 30 is filled with air, the porous film 30 may be in contact with a part of the outer surface of the dielectric layer 50 and the outer surface of the air gap 40. A part of the porous film 30 may be on the upper surface of the substrate 10. The porous film 30 may have a smooth shape. The shape of the air gap 40 may be defined by the outer surface of the dielectric layer 50, the upper surface of the substrate 10 and the inner surface of the porous film 30. Thus, the outer surface of the air gap 40 may include smooth curves and straight lines along the inner surface of the porous film 30.

By way of summation and review, to lower a capacitance between wiring layers, the use of an air gap has been considered. For example, a part of an insulating layer formed on each of two side walls of a metal wiring layer may be etched, and then an insulating film may be deposited again to form an air gap. However, if a dry etching process is used, a capping film of a metal wiring layer having low etching resistance may be deformed or removed. On the other hand, if a wet etching process is used, an etching solution may permeate into a thin portion of the metal film, such that the metal wiring may be collapsed. Therefore, there is a need for a semiconductor device having an air gap formed without deformation or collapse of wiring layers.

As described above, embodiments may provide a semiconductor device with improved electrical characteristics, and a method of forming the same.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
a base substrate;
a protruding structure on the base substrate;
a porous film on a side surface and an upper surface of the protruding structure; and
an air gap between at least a part of the side surface of the protruding structure and the porous film, wherein an angle formed by the side surface of the protruding structure and an inner surface of the porous film varies continuously along the inner surface of the porous film and defines a convex portion and a concave portion along the inner surface of the porous film.

2. The semiconductor device as claimed in claim 1, wherein the angle formed by the side surface of the protruding structure and the inner surface of the porous film is 90° or less.

3. The semiconductor device as claimed in claim 1, wherein the porous film is on an upper surface of the base substrate.

4. The semiconductor device as claimed in claim 1, wherein the base substrate and the protruding structure are implemented as an integral structure.

5. The semiconductor device as claimed in claim 1, wherein the base substrate and the protruding structure include different materials.

6. The semiconductor device as claimed in claim 5, wherein the protruding structure includes a conductive layer.

7. The semiconductor device as claimed in claim 6, wherein a first height from the base substrate to the air gap is larger than a second height from the base substrate to the conductive layer.

8. The semiconductor device as claimed in claim 1, comprising a dielectric layer between the side surface of the protruding structure and an inner surface of the air gap.

9. The semiconductor device as claimed in claim 8, wherein the air gap surrounds a part of an upper surface of the substrate, and is defined by an outer surface of the dielectric layer, the upper surface of the substrate, and an inner surface of the porous film.

10. The semiconductor device as claimed in claim 8, wherein:
the dielectric layer is disposed between the air gap and the base substrate, and
the air gap is defined by an outer surface of the dielectric layer and an inner surface of the porous film.

11. The semiconductor device as claimed in claim 8, wherein the dielectric layer is silicon oxide or silicon nitride.

12. A semiconductor device, comprising:
a base substrate;
a protruding structure on the base substrate;
a porous film extended along a side surface of the protruding structure; and
an air gap between the side surface of the protruding structure and an inner surface of the porous film, wherein:
an upper surface of the base substrate includes a first point spaced from the side surface of the protruding structure by a first distance, and a second point spaced apart therefrom by a second distance greater than the first distance,
a height of the air gap at the first point is greater than a height of the air gap at the second point,
the inner surface of the porous film includes a convex portion and a concave portion, and
the air gap is defined at least in part by the inner surface of the porous film, and an angle formed between the side surface of the protruding structure and the inner surface of the porous film varies continuously along the inner surface of the porous film.

13. The semiconductor device as claimed in claim 12, wherein the porous film is permeable to oxygen, carbon dioxide, and water, and blocks silicon oxide and silicon nitride from passing therethrough.

14. The semiconductor device as claimed in claim 12, wherein the porous film includes silicon oxide or silicon nitride deposited by an atomic layer deposition process at a temperature above a room temperature and below 400° C.

15. The semiconductor device as claimed in claim 12, further comprising an outer insulating layer surrounding a part of the porous film.

16. A semiconductor device, comprising:
a base substrate;
a protruding structure on the base substrate;
a porous film extended along a side surface of the protruding structure; and
an air gap between the side surface of the protruding structure and the porous film, the air gap including a first part having a width continuously decreasing away from an upper surface of the base substrate, wherein an angle formed between the side surface of the protruding structure and an outer surface of the first part of the air gap varies continuously along the outer surface of the first part of the air gap and defines a convex portion and a concave portion along the outer surface of the first part of the air gap.

17. The semiconductor device as claimed in claim 16, wherein the air gap includes a second part having a constant width extending away from the upper surface of the base substrate.

* * * * *